United States Patent
Cleaveland (10) Patent No.: US 9,881,755 B1
(45) Date of Patent: Jan. 30, 2018

(54) MOTORIZED HIGH VOLTAGE IN-LINE DISCONNECT SWITCH WITH HAND-HELD COMMUNICATION SYSTEM TO PREVENT UNWANTED OPERATION

(71) Applicant: CLEAVELAND/PRICE INC., Trafford, PA (US)

(72) Inventor: Charles M. Cleaveland, North Huntingdon, PA (US)

(73) Assignee: CLEAVELAND/PRICE INC., Trafford, PA (US)

( * ) Notice: Subject to any disclaimer, the term of this patent is extended or adjusted under 35 U.S.C. 154(b) by 0 days.

(21) Appl. No.: 15/653,923

(22) Filed: Jul. 19, 2017

Related U.S. Application Data (63) Continuation-in-part of application No. 15/582,626, filed on Apr. 29, 2017.
(60) Provisional application No. 62/412,920, filed on Oct. 26, 2016.

(51) Int. Cl.

| | | |
|---|---|---|
| *B23K 11/24* | (2006.01) | |
| *H01H 33/16* | (2006.01) | |
| *H02H 3/05* | (2006.01) | |
| *H01M 10/46* | (2006.01) | |
| *H02S 40/38* | (2014.01) | |
| *G01R 15/18* | (2006.01) | |
| *G01R 21/133* | (2006.01) | |

(52) U.S. Cl.
CPC .............. *H01H 33/16* (2013.01); *G01R 15/18* (2013.01); *G01R 21/133* (2013.01); *H01M 10/465* (2013.01); *H02H 3/05* (2013.01); *H02S 40/38* (2014.12)

(58) Field of Classification Search
CPC ........ H01H 33/16; H02S 40/38; G01R 15/18; G01R 21/133; H01M 10/465; H02H 3/05
See application file for complete search history.

(56) References Cited

U.S. PATENT DOCUMENTS

| | | |
|---|---|---|
| 4,492,835 A | 1/1985 | Turner |
| 6,392,181 B1 | 5/2002 | Cleaveland et al. |
| 6,753,492 B1 | 6/2004 | Cleaveland |
| 6,762,385 B1 | 7/2004 | Kowalik et al. |
| 7,078,642 B2 | 7/2006 | Kowalik et al. |
| 2017/0047186 A1* | 2/2017 | Chen .................. G01R 31/3271 |

OTHER PUBLICATIONS

Cleaveland/Price Inc. Bulletin DB-1021B11, entitled "Type ILO-C Hookstick Operated In-Line Transmission Switch 69 kV-230 kV 1200 A.", 4 pages.

\* cited by examiner

*Primary Examiner* — Daniel Cavallari
(74) *Attorney, Agent, or Firm* — Ronald S. Lombard (57) ABSTRACT

A high voltage in-line air break disconnect switch suspended by an electric power line conductor wherein the switch includes a rotating switch blade that is operated by a communication system controlled motor that may include a switch mounted radio which is controlled by another radio located in a hand-held portable controller that is battery powered to provide a secure way to open and close a switch without traditional padlockable manual operators that are vulnerable to terrorist attacks. The communication system controlled motorized in-line air break disconnect switch is battery operated and solar charged.

17 Claims, 13 Drawing Sheets

MOTORIZED HIGH VOLTAGE IN-LINE DISCONNECT SWITCH WITH HAND-HELD COMMUNICATION SYSTEM TO PREVENT UNWANTED OPERATION

CROSS-REFERENCE TO RELATED APPLICATIONS

This is a continuation-in-part application and claims the benefit of U.S. patent application Ser. No. 15/582,626 filed Apr. 29, 2017, which is incorporated herein by reference in its entirety. The said U.S. patent application Ser. No. 15/582,626 claims the benefit of U.S. Provisional Application No. 62/412,920 filed Oct. 26, 2016, which is also incorporated herein by reference in its entirety.

BACKGROUND OF THE INVENTION

The present invention relates generally to an air break disconnect switch for high voltage electrical applications and, more particularly, to an in-line high voltage air break disconnect switch that mounts in-line with the transmission or substation line conductor without the need of a group operated switch with associated ground supported mounting structure. Such an in-line high voltage disconnect switch hangs from and is supported by its associated power line.

One example of such an in-line high voltage disconnect switch is a disconnect switch currently manufactured and sold by Cleaveland/Price Inc., of Trafford, Pa., the present Assignee, as a type ILO-C, Hookstick Operated In-Line Transmission Switch. The switch is described in Cleaveland/Price Bulletin DB-1021B11, entitled "Type ILO-C Hookstick Operated In-Line Transmission Switch 69 kV-230 kV 1200 A.". The switch is rated 69 kV-230 kV, 1200 amperes. The Cleaveland/Price Inc. type ILO-C In-Line high voltage disconnect switch utilizes a manually operated hookstick for engaging an operating eye ring attached to the breakjaw end of the switch blade of the switch. The hookstick when engaged with the operating ring imparts rotation about the hinge end of the switch blade for opening and closing of the switch. The Cleaveland/Price Inc. type ILO-C In-Line high voltage disconnect switch is a single phase switch and is versatile and can serve many functions on a three phase system. The switch can be used to sectionalize long transmission lines, disconnect lines from substations, serve as a line tap switch, and serve as a temporary maintenance switch, for example. The Cleaveland/Price Inc. type ILO-C In-Line high voltage disconnect switch saves significant installation costs compared to a non-in-line switch installed via direct ground support mounting structure. The Cleaveland/Price Inc. type ILO-C high voltage disconnect switch allows for easy, cost efficient sectionalizing of high voltage transmission lines and isolation in high voltage substations. As a result of this, the type ILO-C In-Line high voltage disconnect switch has been used by electric utilities for many years to isolate transmission and substation circuits.

In recent years the electric utility industry has been interested in modernizing the electrical power infrastructure. It is also of concern that the electric system in the U.S.A. is vulnerable to attack by "terrorists". Nearly every electric switch in a substation or on a transmission line is mechanically operated at ground level by a swing handle, geared hand crank or motor operator which is only secured from operation by a padlock which can be easily cut with bolt cutters. The cutting of the padlock gives the "terrorist" the ability to operate the switch which may damage the switch and may cause power outages. It is therefore an object of this invention to provide an improved in-line high voltage disconnect switch that may be used in applications for switching the electric power grid while preventing "terrorists" from being able operate the switch.

SUMMARY OF THE INVENTION

The present invention is described as a communication system controlled in-line motorized high voltage disconnect switch and provides a substantial improvement of the prior art in-line switch. The present invention safeguards against unauthorized persons from being able to operate any type of switch at ground level. The present invention of the three phase motorized in-line switch has no control enclosure mounted at ground level with local electric close-open controls that could be operated by an unauthorized person, such as a "terrorist". Rather, the close-open function is initiated via a portable wireless hand-held control box or controller with a radio transmitter that communicates via an antenna with each in-line switch mounted radio with via three switch mounted antennas on a three phase arrangement. The hand-held control box or controller transmits a radio signal that is encrypted so "terrorists" or other unauthorized individuals can not duplicate a radio signal to operate the in-line high voltage disconnect switch. Utility personnel keep the hand-held controller in a secure place so that the switch is safe from unwanted operation. The present invention utilizes the insulator and switch current carrying parts of the above-described Cleaveland/Price Inc. type ILO-C high voltage disconnect switch, but the present invention switch may be operated by a communication system controlled switch mounted motor instead of a hookstick to operate the switch. Each switch mounted radio commands the motor to open or close the switch. The radio controlled motorized in-line high voltage disconnect switch of the present invention, for example, in one embodiment is configured as a vertical air break disconnect switch and in another embodiment as a side air break disconnect switch. The in-line high voltage disconnect switch is motor powered by a solar charged battery which also powers the switch mounted radio and a remote terminal unit, i.e., RTU device. Another name for the RTU device is "remote terminal unit". The RTU is a microprocessor-controlled electronic device that receives a radio signal and decodes the signal to operate a relay that opens or closes the motor operated switch.

In a three-phase electric power installation the present invention provides in one embodiment three (3) motorized in-line high voltage disconnect switches, one for each phase, each with a battery and solar panel for charging the battery. A current transformer could also be used to charge the battery in addition to or instead of solar panels as long as current flows in the line. The hand-held transmitter communicates to each switch mounted radio, which allows the three switches of this embodiment of a three-phase installation to be activated simultaneously.

The switch blade of each of the in-line high voltage disconnect switches of the present invention includes a switch mounted worm gear drive including a worm screw coupled to and activated by the switch motor. A worm gear is operatively attached to the hinge pin and switch blade member of the switch blade at a hinge end of the switch blade and engages the worm screw. When the switch mounted motor is energized the worm gear rotates causing the switch blade member to rotate, as a result causing the switch blade to rotate about the axis of the hinge pin member from the open to the closed position or vice versa. At the opposite end of the switch blade is a contact for contacting a switch break jaw when the switch is closed. In some embodiments of the present invention the power line for each of the switches is cut in two or split at the switch. Each in-line high voltage switch includes a polymer strain insulator which is provided with power line connection points at opposite ends in the form of clevises and dead-end fittings for respectively mounting each cut end of the power line to the polymer insulator which carries the strain load of the line. The switch may also be connected to a solid bus of a substation with clamp connectors. The in-line high voltage disconnect switch of the present invention therefore hangs on the conductor. The conductor at a first cut end is electrically connected to the switch terminal at the hinge end and the conductor is electrically connected to a switch break jaw terminal at a second cut end.

The improved radio controlled motorized in-line switch of the present invention, may or may not include an eye ring operatively affixed to the worm so that the switch may still be manually turned with a hookstick or hot stick which engages the eye ring. The eye ring is included because of the lower chance of an unauthorized person using a hot stick to operate the switch from a bucket truck, which is unlikely, since the conductors are usually hanging a considerable distance above the ground.

A housing is mounted at the hinge end of each in-line switch. The housing encloses the worm drive and motor. The housing also typically encloses and supports devices such as, the battery, power and control boards, transformer, switch mounted radio and fuses. On the exterior of the housing one or more solar panels for powering the battery may be mounted. Also radio antennas are mounted to the housing for communication to the hand-held controller.

The radio controlled motorized in-line high voltage disconnect switches of the present invention do not require a dedicated structure to mount the switches in a traditional manner, such as mounted to a metal framework, which is expected to result in advantageous commercial value for electric utilities. By eliminating the traditional dedicated mounting support structures obvious cost savings may be realized.

The radio controlled motorized in-line switch of the present invention may also include a quick break whip or a vacuum interrupter in order to interrupt current.

These and other aspects of the present invention will be further understood from the detailed description of the particular embodiments, drawings and claims.

DETAILED DESCRIPTION OF THE PARTICULAR EMBODIMENTS

Figure 2:
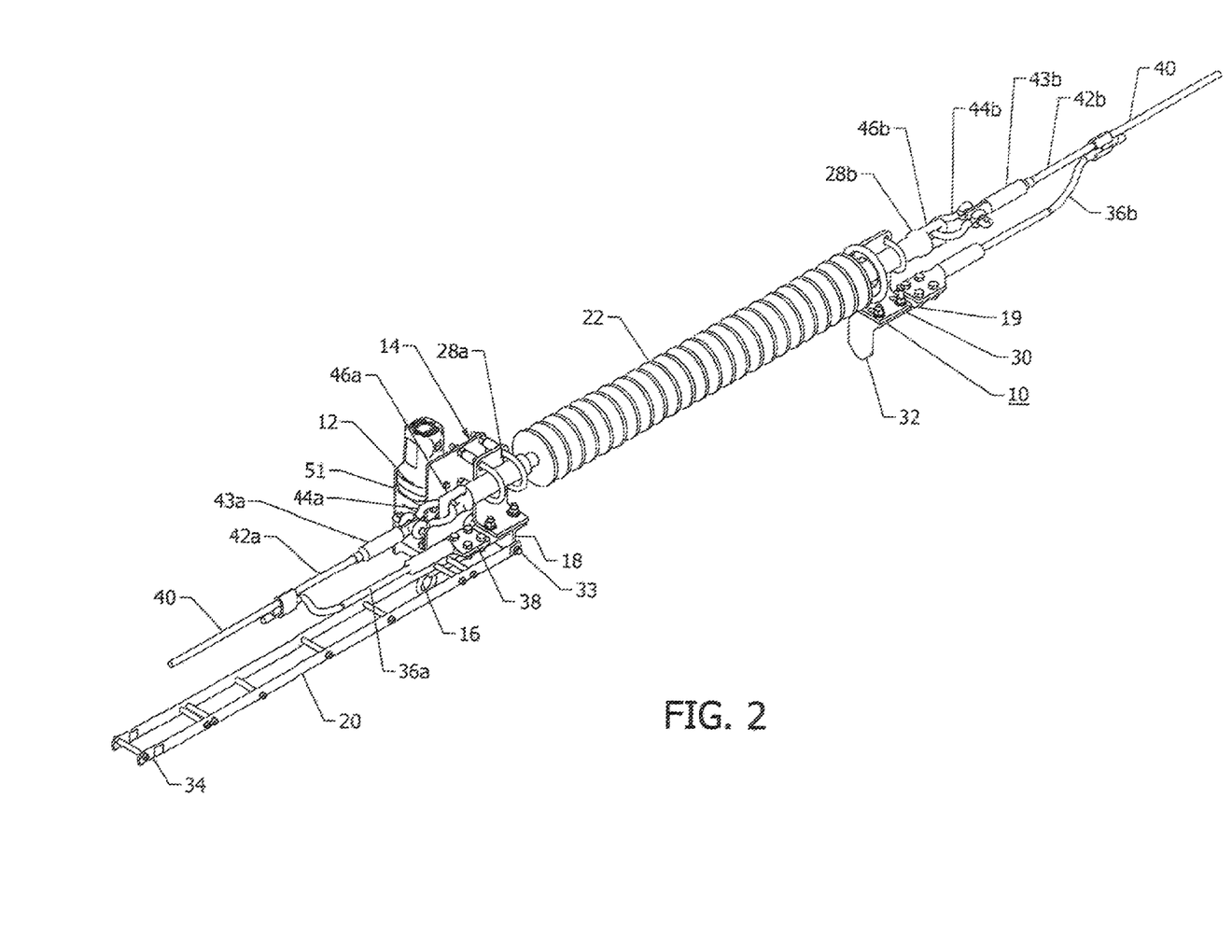
FIG. 2 is the same switch shown in FIG. 1 with the switch open.
Figure 3:
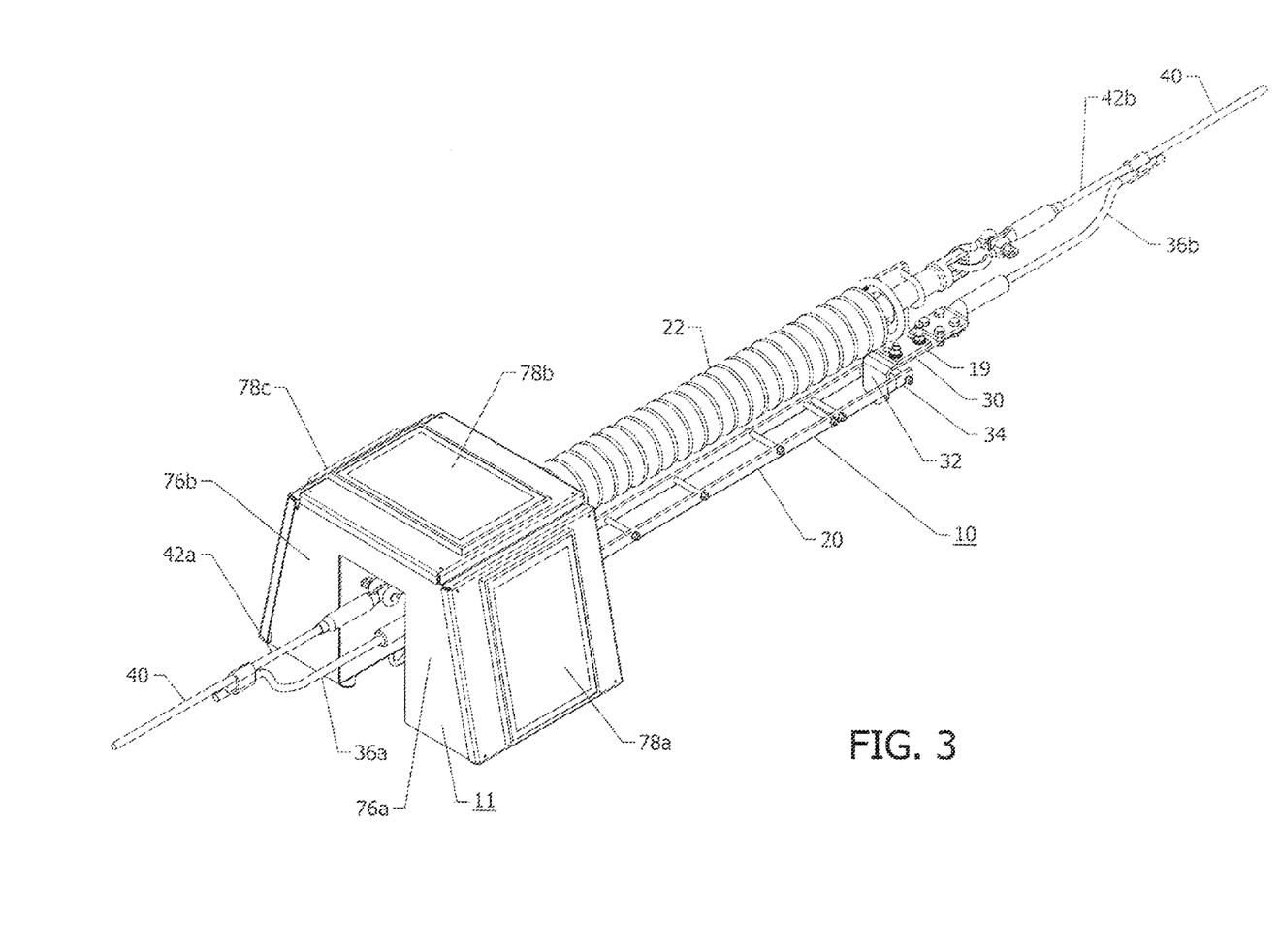
FIG. 3 is a perspective view of the in-line high voltage vertical break disconnect switch of the present invention showing the housing mounted at the hinge end of the switch with solar panels attached to the housing and the switch blade in the closed position.
Figure 4:
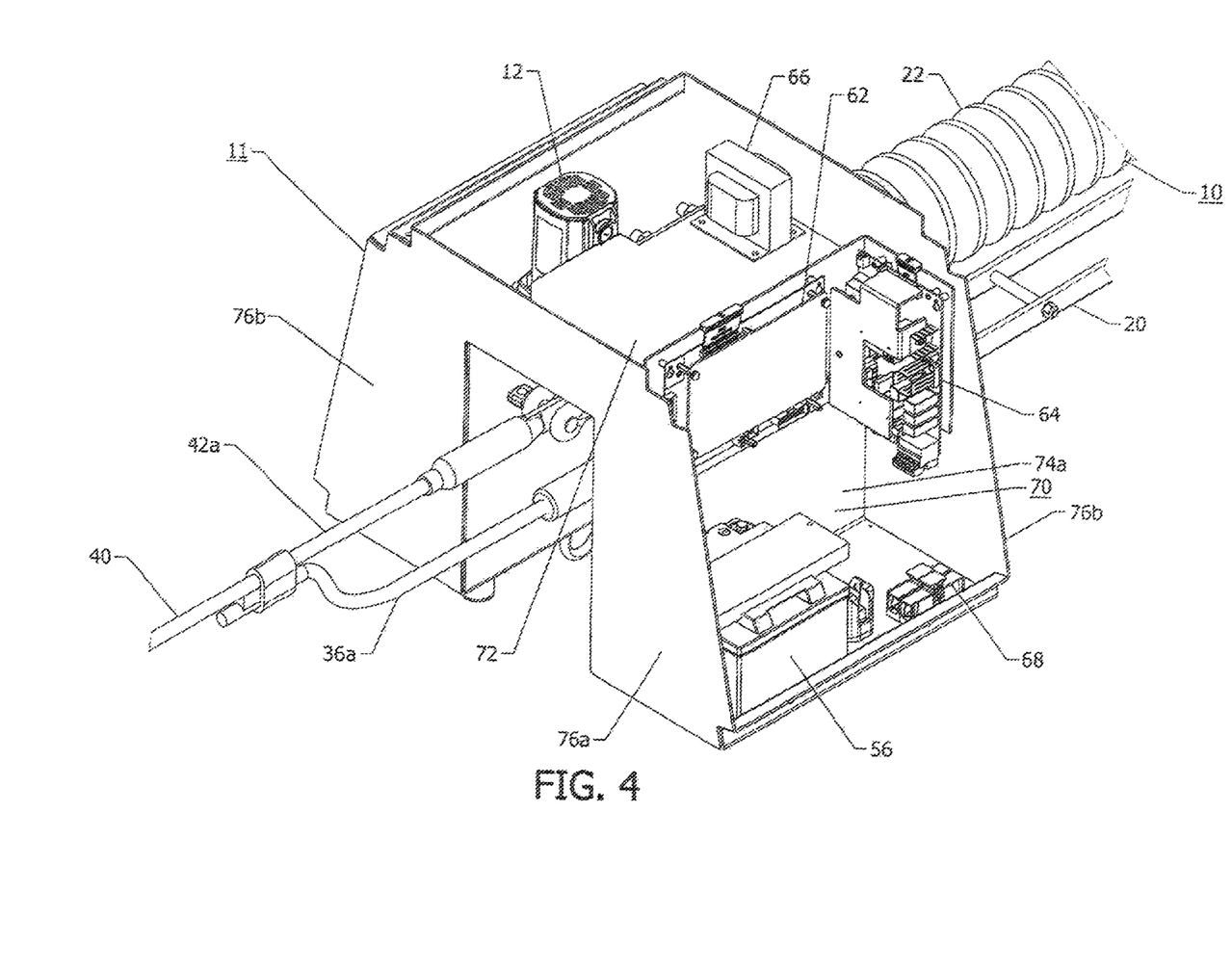
FIG. 4 is a partial perspective view of the in-line high voltage vertical break disconnect switch of the switch shown in FIG. 3 of the present invention at the hinge end showing the components mounted within the housing with two of the solar panels removed.

FIGS. 1-7A show one embodiment of the radio controlled motorized in-line air break disconnect switch 10 of the present invention, which in this embodiment is a vertical break disconnect switch. FIG. 4 depicts the switch 10 with the housing 11 enclosing a motor 12. The housing 11 is removed at the rotating hinge contact end 14 of the disconnect switch 10 in FIGS. 1 and 2. The radio controlled motorized in-line vertical air break switch 10 of the present invention depicted in FIGS. 1-7A, as mentioned, is an improvement over the in-line vertical break disconnect switch, type ILO-C currently manufactured and sold by Cleaveland/Price Inc., of Trafford, Pa., the present Assignee, which is a hookstick operated transmission switch. The communication system controlled in-line air break disconnect switch 10 of the present invention includes the following components in common with the Cleaveland/Price Inc. type ILO-C in-line vertical air break disconnect switch. The in-line disconnect switch 10 of the present invention utilizes the polymer strain insulator 22 and other switch current carrying parts of the Cleaveland/Price Inc. type ILO-C prior art switch.

Figure 1:
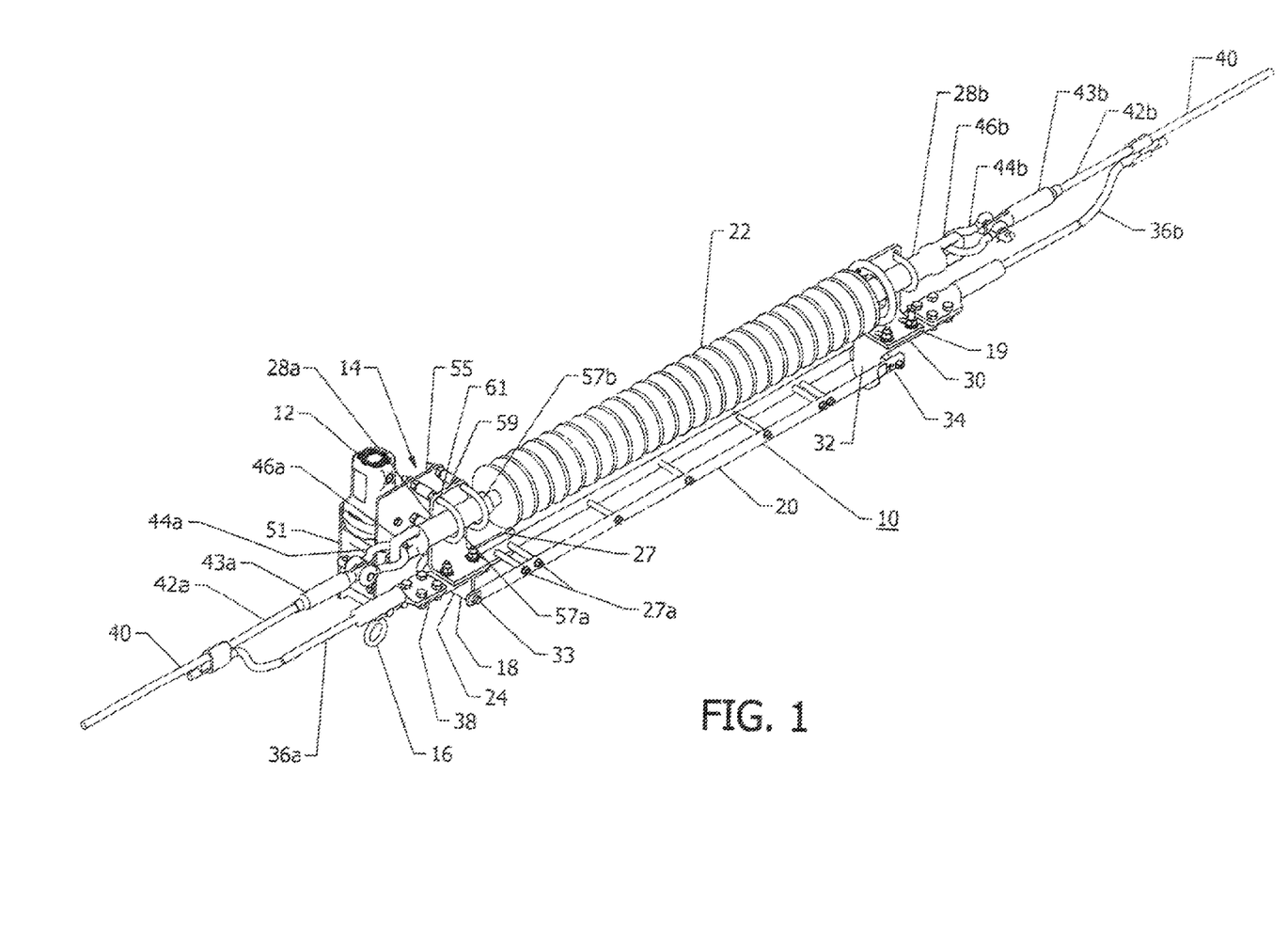
FIG. 1 is a perspective view of the motorized in-line high voltage vertical break disconnect switch of the present invention with the housing removed, showing the switch in the closed position.

As shown in FIGS. 1 and 2 the other common switch current carrying parts includes in this embodiment the vertically rotating switch blade 20. A hinge contact member 24 is included at the hinge end 18 of the switch 10 and is connected in circuit to a hinge terminal 38. The hinge contact member 24 includes a hinge pin 33 that switch blade 20 rotates about. The hinge end 18 of the switch 10 is mounted proximate one end 28a of the strain insulator 22. The switch 10 also includes a break jaw end 19 which is mounted proximate the other end 28b of the strain insulator 22 and a switch break jaw contact terminal 30. The switch break jaw contact terminal 30 includes an integral breakjaw contact 32 for contacting the switch blade end 34 when the switch is closed. The switch 10 also includes jumpers 36a, 36b attached in the circuit respectively, to a hinge terminal 38 and the switch break jaw terminal 30. As shown in FIG. 1, a conductor 40 has been cut, resulting in two line ends 42a, 42b. Each line end 42a, 42b is respectively attached to strain cable fittings 43a, 43b and to shackles 44a, 44b. The present invention applies to electric power lines including transmission lines and substation lines, for example. The shackles 44a, 44b respectively engage chain eye end fittings 46a, 46b at the ends 28a, 28b of the strain insulator 22. The line 40 may support the in-line vertical air break disconnect switch 10 without the switch 10 being attached directly to a dedicated support structure, such as metal framework. The jumpers 36a, 36b carry the line current in circuit with the switch blade 20 via the contacts 32 and 24.

Figure 5:
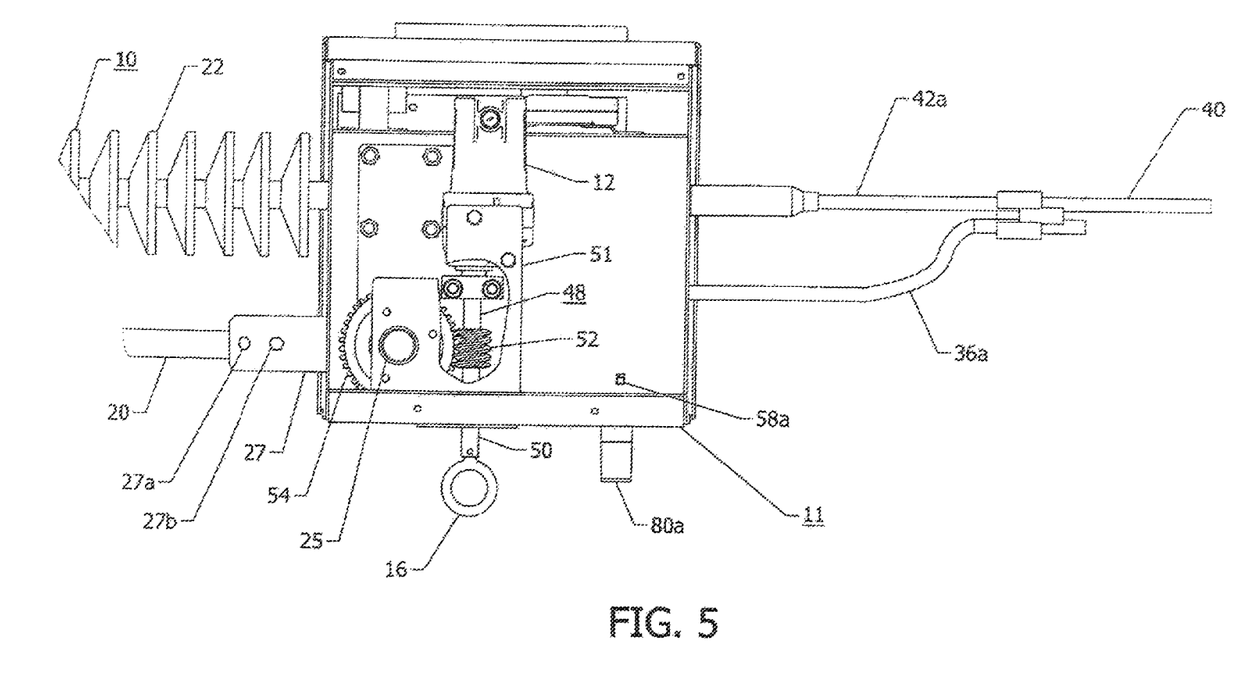
FIG. 5 is a side view of the hinge end of the switch of FIG. 4 looking from the opposite side of the switch with the solar panel removed.
Figure 6:
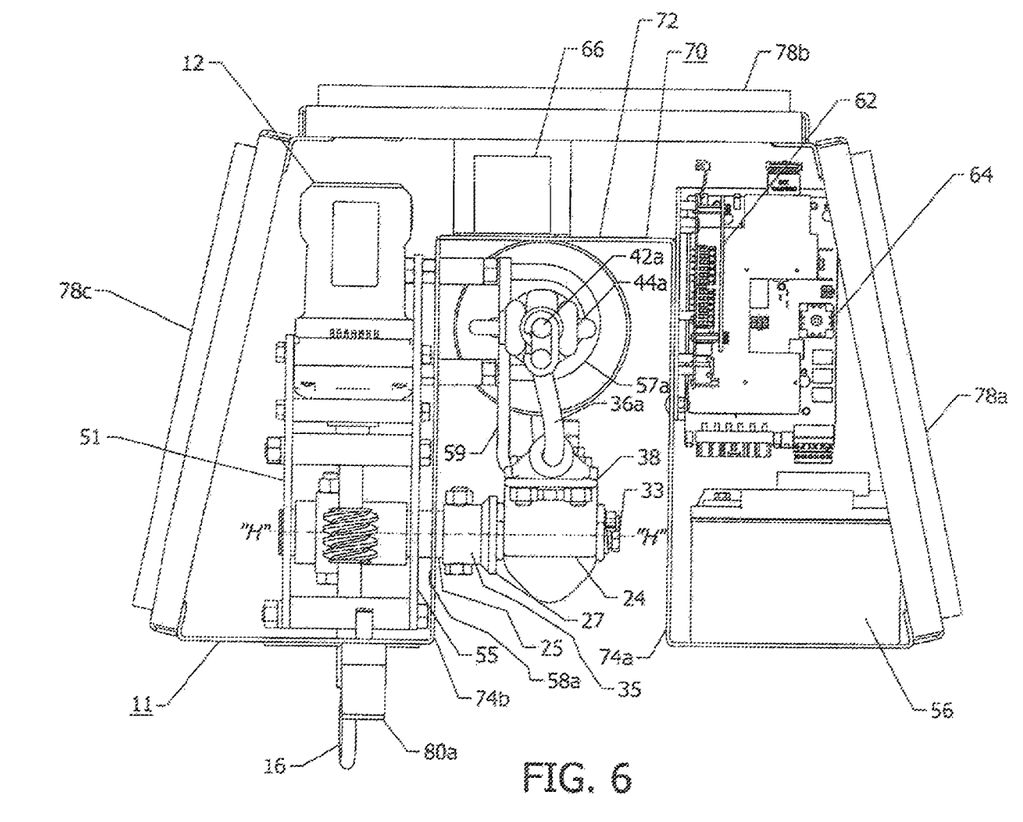
FIG. 6 is an end view of the hinge end of the in-line high voltage disconnect switch of the present invention as shown in FIG. 3 with the housing end sheets removed.
Figure 7A:
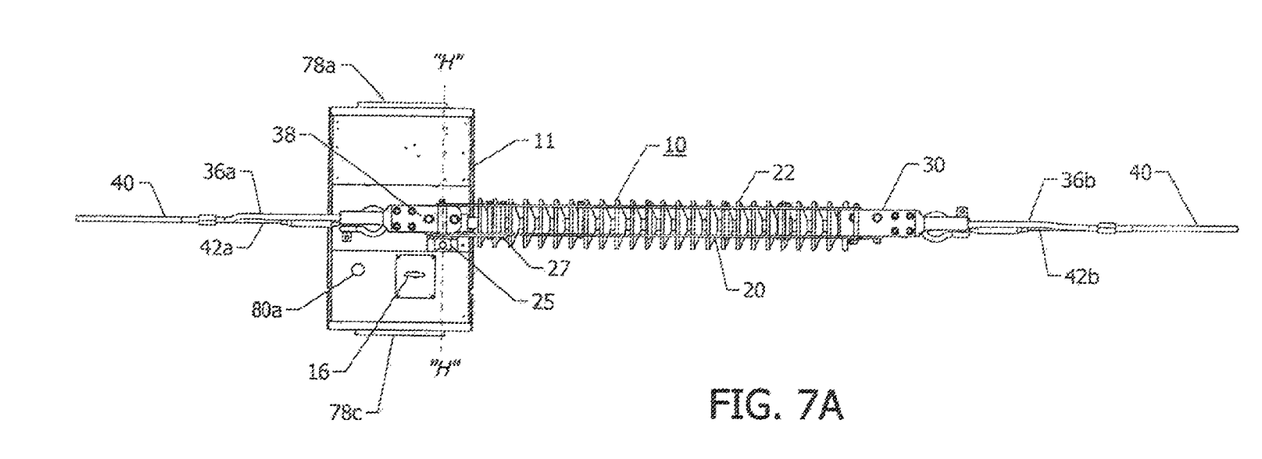
FIG. 7A is a view of FIG. 3 of the switch of the present invention looking up from the ground to the underside without the addition of a current transformer.
Figure 7B:
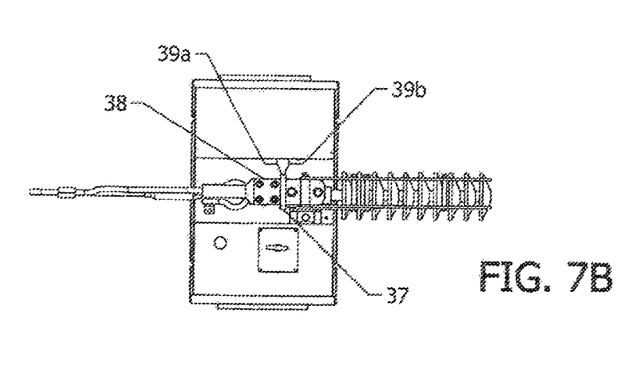
FIG. 7B is the same as FIG. 7A but with the addition of a current transformer.
Figure 9:
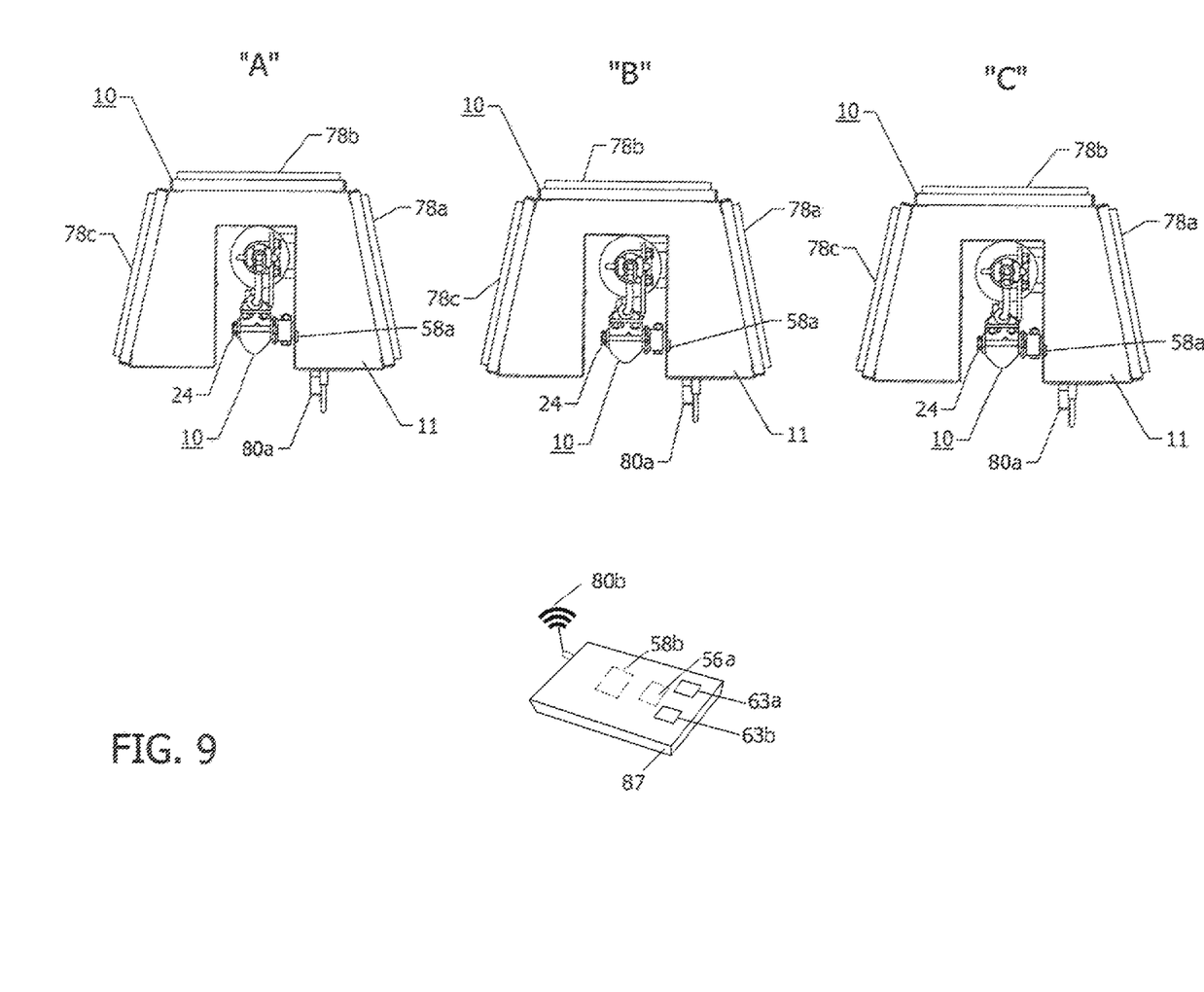
FIG. 9 is the same as FIG. 8, but a hand-held controller is shown.

The motorized in-line vertical air break disconnect switch 10 in addition to the these common current carrying parts with the type ILO-C in-line Cleaveland/Price Inc. air break disconnect switch also, include the following additional components. The motor 12 is included for driving a worm drive 48, which as shown for example in FIG. 5. The worm drive 48 includes shaft 50 of the motor 12 operatively attached to a worm 52 carried by the worm shaft 50, which is in operative engagement with a worm gear 54 carried on the output shaft 25 which is axially aligned with the rotating hinge axis "H" shown in FIG. 7A. The shaft 25 is connected via bolted hub 35 to drive bar 27 which is connected at bolts 27a, 27b to the switch blade 20 for rotational motion shown in FIGS. 5 and 6. The motor 12 is carried on a motor mounting 51 as shown in FIG. 6. The motor mounting 51 is attached to plate 55 which carries U-bolts 57a, 57b as shown in FIGS. 1 and 6. The motor 12 may be a type AC/DC having a ¾ horsepower rating, for example. The U-bolts 57a, 57b pass through apertures 61 in L-shaped bracket 59, shown in FIG. 1. The one end 28a of the strain insulator 22 passes through the U-bolts 57a, 57b as shown in FIG. 1. FIGS. 5 and 6 show a manual operating eye ring 16 is attached at the end of the worm shaft 50 for cooperating with a hookstick, not shown, in case the motor 12 is inoperable. The in-line high voltage disconnect switch 10 as mentioned is powered by a solar charged battery 56 attached to housing 11, as shown in FIGS. 4 and 6. The solar charged battery 56 powers the motor 12, and also a switch mounted short range radio 58a as shown in FIG. 6. The housing 11 also carries a control board with RTU 62, a power board 64, a transformer 66 and fuses 68 which are also powered by the solar charged battery 56. These switch components operate as follows:

A utility worker may desire to open or close the switch 10 by way of sending a radio command from the hand-held controller 87, shown in FIG. 9, to the three phase switching arrangement and the signal is translated via the RTU, i.e., remote terminal unit, to operate the contacts, not shown, on the control board 62 which energizes the motor 12 to turn either forwards or backwards to open or close the switch 10. The power board 64 takes power from the solar panels 78a, 78b, 78c shown in FIG. 3 and charges the battery 56 at a rate that does not over charge the battery to run the motor 12 at 125 VDC. The power board 64 includes an inverter, not shown, that converts 12 VDC to AC. Then the transformer 66 raises the voltage to 125 VAC which is rectified by the power board 64 to 125 VDC. The fuses 68 protect the circuit. The short range radio 58a shown in FIGS. 5 and 6 in each phase receives a communication from the hand-held controller 87 to open simultaneously all three switches 10. A current transformer 37, as shown in FIG. 7B, may be mounted around the hinge terminal 38 and can be used to provide additional power to charge the battery 56 via current transformer leads 39a, 39b which are connected to power board 64 in circuit with the battery, the connection to the power board 64 is not shown in the drawings.

As seen in FIG. 6, the housing 11 in one embodiment includes an inverted U-shaped inner housing panel 70. The inverted U-shaped inner housing panel 70 includes a top panel 72 and two oppositely disposed L-shaped panels 74a, 74b which extend respectively on opposite sides of the top panel 72. As can be seen by reference to FIGS. 4 and 6, transformer 66 may be attached, for example, to the top panel 72. The control board 62, solar charged battery 56, and fuses 68 are mounted to the first L-shaped panel 74a. The motor 12 is supported by the motor mountings 51 and 55 which are positioned as shown in FIG. 6 attached to the second L-shaped panel 74b. The housing 11, in this embodiment, also includes a first end wall 76a and a second end wall 76b which are attached as shown in FIG. 4 to the inverted U-shaped inner housing panel 70. The housing 11, in this embodiment, also includes three solar panels 78a, 78b, and 78c, or more, attached between the first and second end walls 76a, 76b, as shown in FIGS. 3 and 6, for example. Antenna 80a for the short range radio 58a is mounted on the underside of the housing 11 as shown in FIG. 6. As shown for example in FIGS. 4-7A, when the housing 11 is maintained in position over the hinge end 18 of the switch 10, the solar panels 78a, 78b, and 78c, in addition to powering the battery 56, act as protective weather shields for the previously described components carried within housing 11 and for the rotating hinge contact 24.

Figure 8:
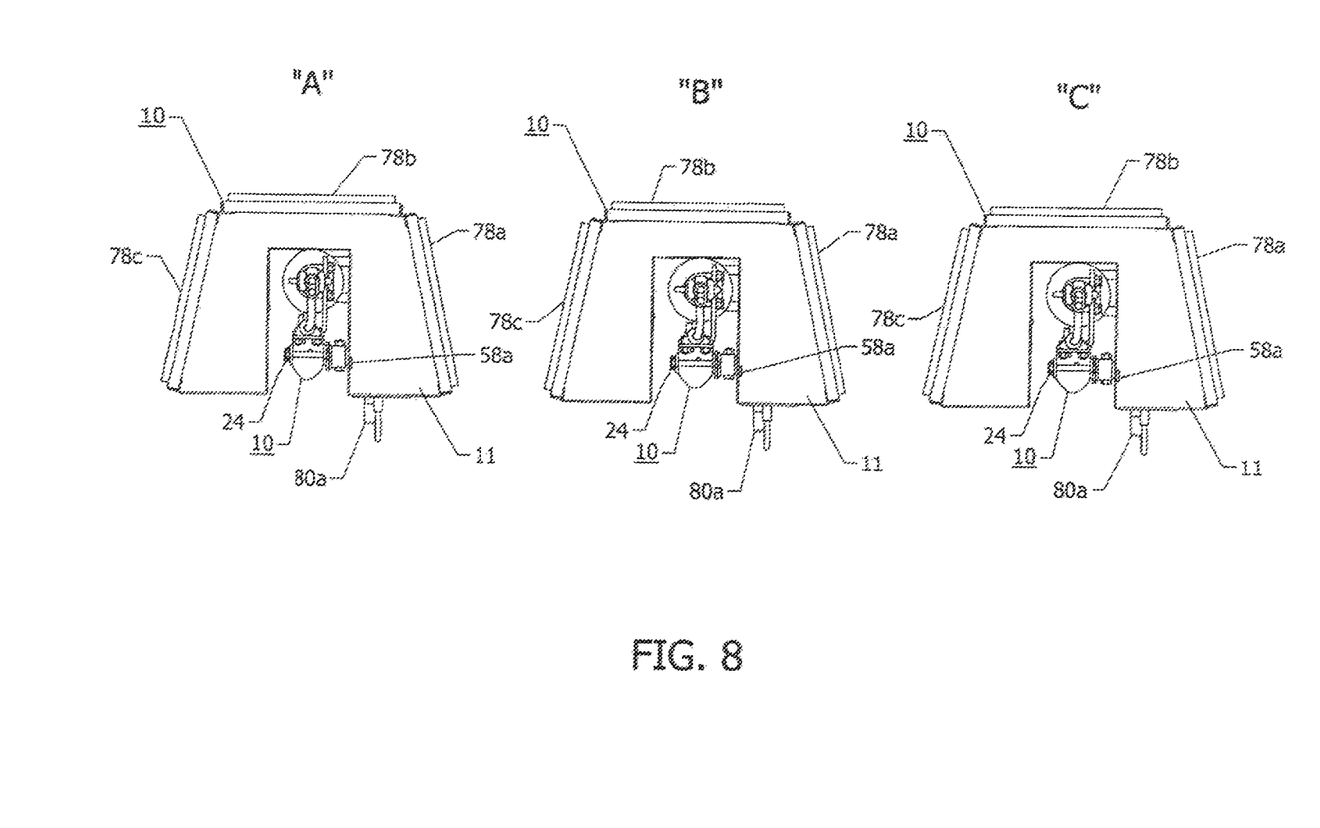
FIG. 8 is a schematic showing the present invention in end view with phases A, B, and C of the electric system.

FIG. 8 shows schematically hinge end elevation views of three radio controlled motorized in-line air break disconnect switches 10 of the present invention. The vertical break disconnect switch 10 of this embodiment is operatively arranged on the phases 'A', 'B', and 'C' of an electric utility system. Each switch 10 of the three phases 'A', 'B', and 'C' may contain, as mentioned, a switch mounted short range radio 58a, as also shown in FIG. 5, which utilizes attached radio antenna 80a to communicate with the hand-held controller 87. The three switches 10 mounted in the three phases 'A', 'B', and 'C' communicate with the hand-held controller 87 via the three short range switch mounted radios 58a; which allow the three switches 10 of the three phases 'A', 'B', and 'C' to be actuated simultaneously, for example, if desired. The present invention is very beneficial for electric utilities because, as mentioned, there is no need for a dedicated ground supported structure to mount switches in a traditional manner and there is no mechanical linkage to operate the switches from the ground, which are vulnerable to unwanted operation.

FIG. 9 shows the same three phase switch arrangement as FIG. 8, but shows the portable wireless hand-held controller 87 which transmits a signal via onboard short range radio 58b and onboard antenna 80b to the three switches above to open or close the switches. The hand-held controller 87 also preferably includes a replaceable battery 56a, as shown in FIG. 9. The hand-held controller 87 may also include an open switch button 63a and a close switch button 63b, for example. When the open switch button 63a is pressed it activates the onboard short range radio 58b to communicate with the switch mounted short range radio 58a of each of the three switches to open the three switches 10. When the close switch button 63b is pressed it activates the onboard short range radio 58b to communicate with the switch mounted short range radio 58a of each of the three switches to close the three switches 10. The portable wireless hand-held controller 87 is carried by a utility operator person. This embodiment allows the three switch mounted short range radios 58*a* to communicate via antenna 80*a* with the short range radio 58*b* mounted in the hand-held controller 87 to allow local operation at ground level to actuate the three phases 'A', 'B', and 'C'. As previously mentioned that hand-held control box or controller 87 transmits a radio signal that is encrypted so "terrorists" or other unauthorized individuals can not duplicate a radio signal to operate the in-line high voltage disconnect switch. Such encryption may typically include 128 bits of encryption. Utility personnel keep the hand-held controller 87 in a secure place so that the switch is safe from unwanted operation.

Figure 10:
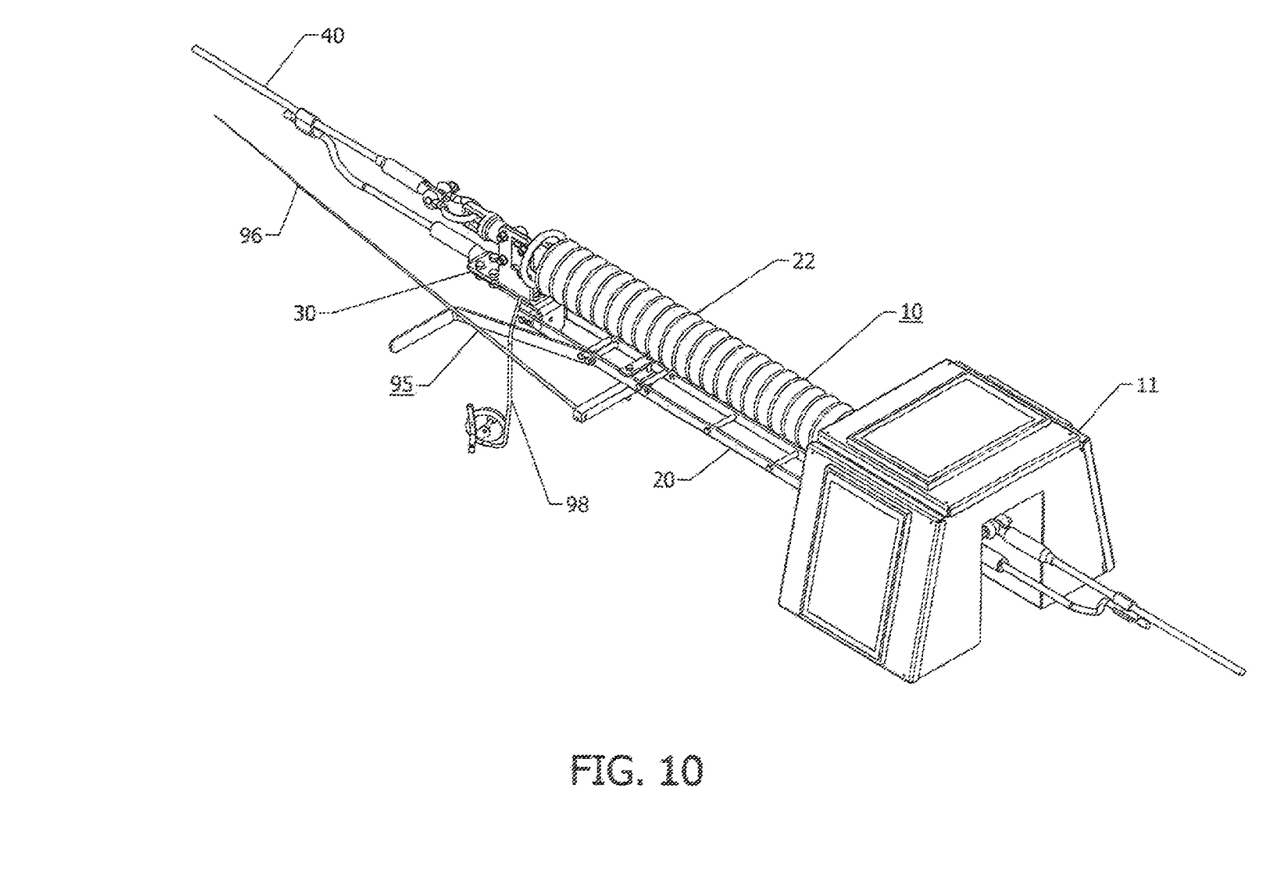
FIG. 10 is a perspective view of an in-line vertical break disconnect switch of the present invention carrying a quick break whip, showing the switch in the closed position.

FIG. 10 shows the radio controlled motorized in-line vertical break switch 10 of the present invention includes an arc extinguishing device 95 which includes a quick break whip 96 attached to blade 20. The arc extinguishing device 95 includes a stationary contact latch member 98 attached to switch break jaw terminal 30. This device allows long lines to be interrupted. For further reference regarding quick break whips, see U.S. Pat. No. 6,392,181 B1, issued May 21, 2002, including joint inventors of which one was the present inventor, Charles M. Cleaveland and assigned to Cleaveland/Price Inc., the present Assignee, Also see U.S. Pat. No. 6,753,492 B1, issued Jun. 22, 2004, by the present inventor, assigned to Cleaveland/Price Inc., the present Assignee. Also see U.S. Pat. No. 6,762,385 B1, issued Jul. 13, 2004, including joint inventors of which one was the present inventor, assigned to Cleaveland/Price Inc. the present Assignee. Also see U.S. Pat. No. 7,078,642 B2, issued Jul. 18, 2006, including joint inventors of which one was the present inventor, assigned to Cleveland/Price Inc., the present Assignee. All of the above-mentioned patents, i.e., U.S. Patents Nos.: U.S. Pat. No. 6,392,181 B1; U.S. Pat. No. 6,753,492 B1; U.S. Pat. No. 6,762,385 B1; U.S. Pat. No. 7,078,642 B2 are incorporated herein by reference in their entireties which describe quick break whip art which is assigned to the present Assignee.

Figure 11:
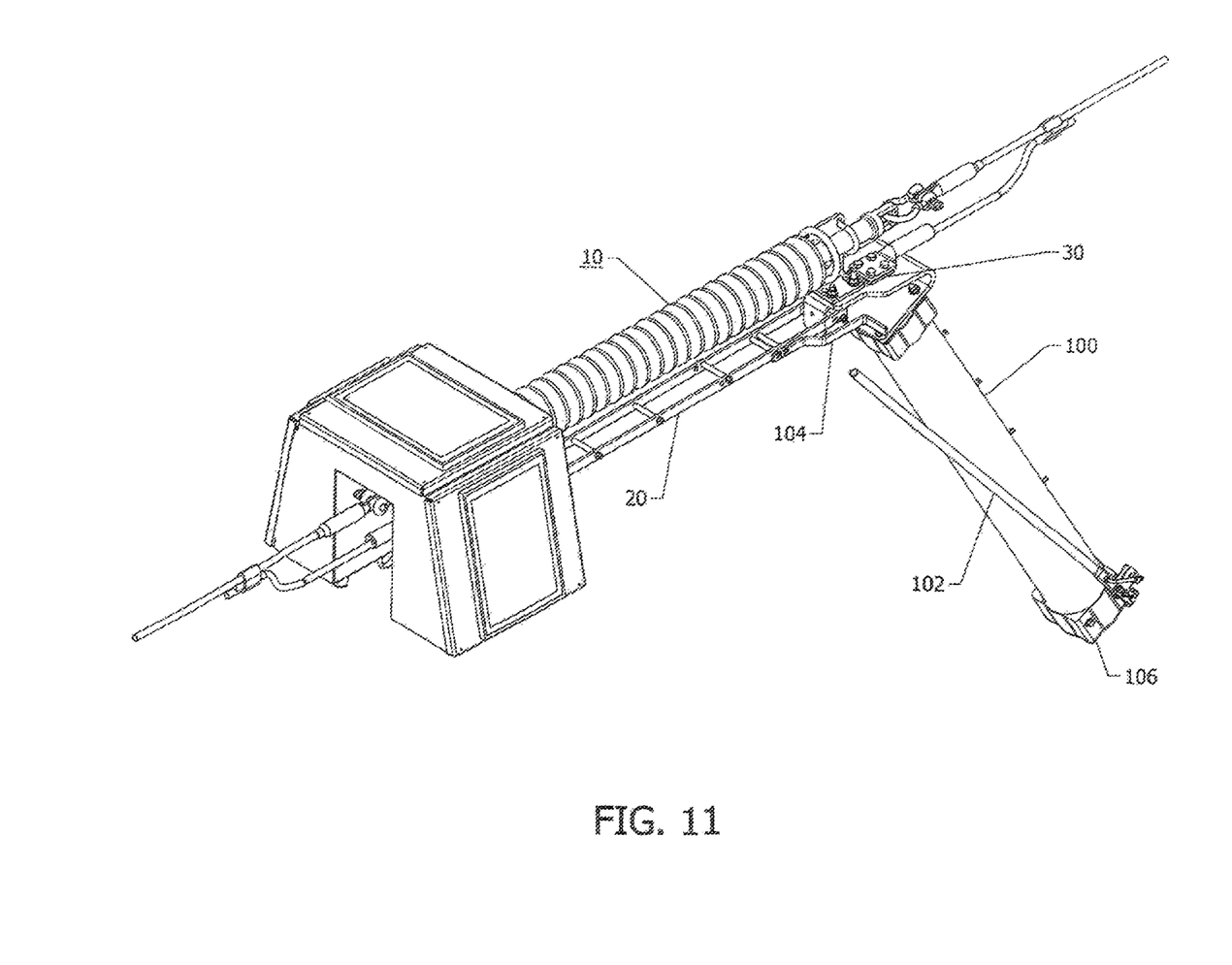
FIG. 11 is a perspective view of an in-line vertical break disconnect switch of the present invention carrying a vacuum interrupter, showing the switch in the closed position.

FIG. 11 shows the radio controlled motorized in-line vertical break switch 10 of the present invention including a vacuum interrupter 100 attached to the switch break jaw terminal 30. Such vacuum interrupter devices including multiple vacuum bottles connected in series circuit arrangement to extinguish an arc are well known, such as described in U.S. Pat. No. 4,492,835 to John L. Turner, issued Jan. 8, 1985. As the blade 20 rotates the actuating arm 102 of the vacuum interrupter 100 is contacted by the moving arc horn 104 for tripping the internal mechanism of the vacuum interrupter, not shown in the drawings. The housing 106 of the vacuum interrupter 100 contains the internal mechanism.

Figures 12A, 12B:
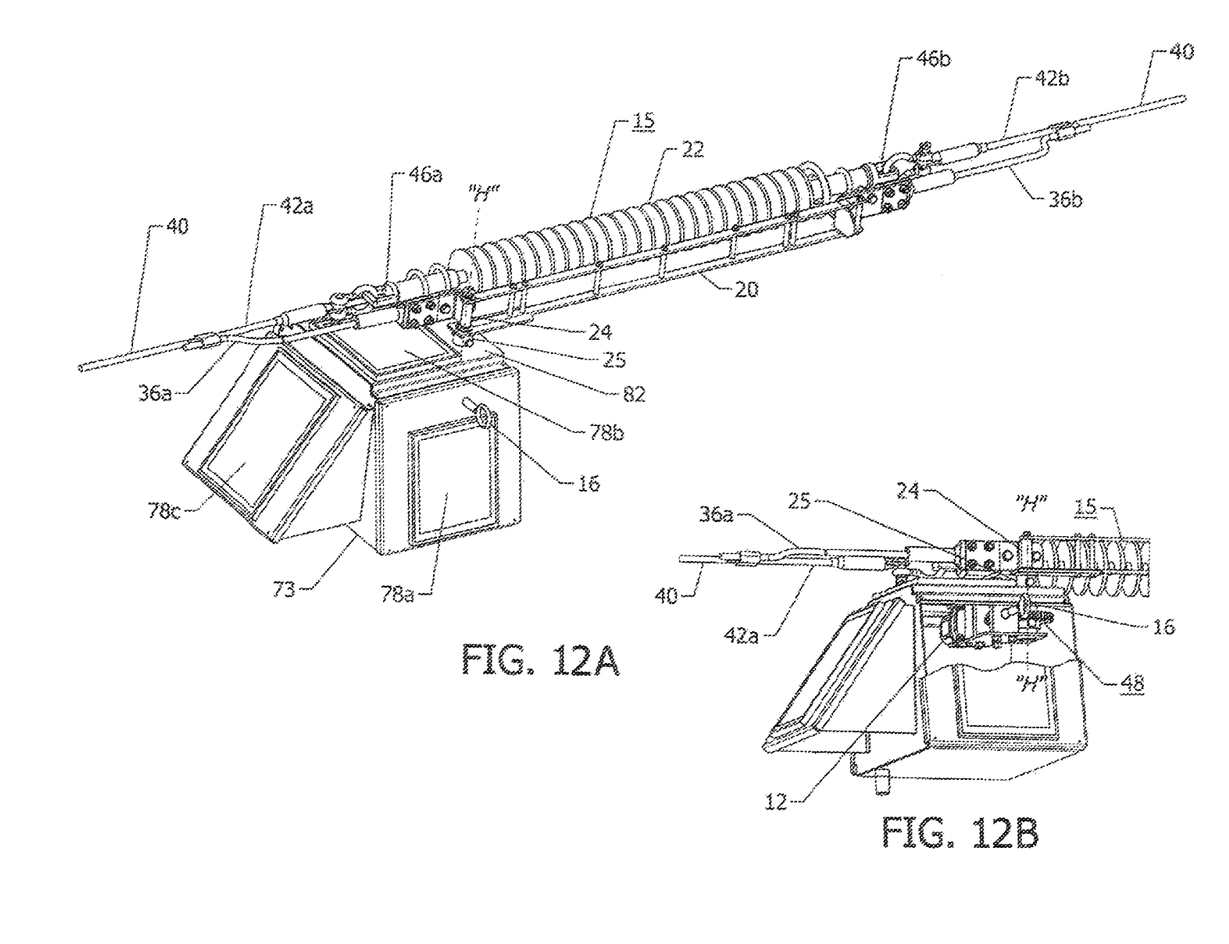
FIG. 12A is a perspective view of an in-line side break disconnect switch of the present invention, showing the switch in the closed position.
FIG. 12B is a cut away view of an in-line side break disconnect switch of the present invention shown in FIG. 12A, showing the motor and worm drive.
Figure 13:
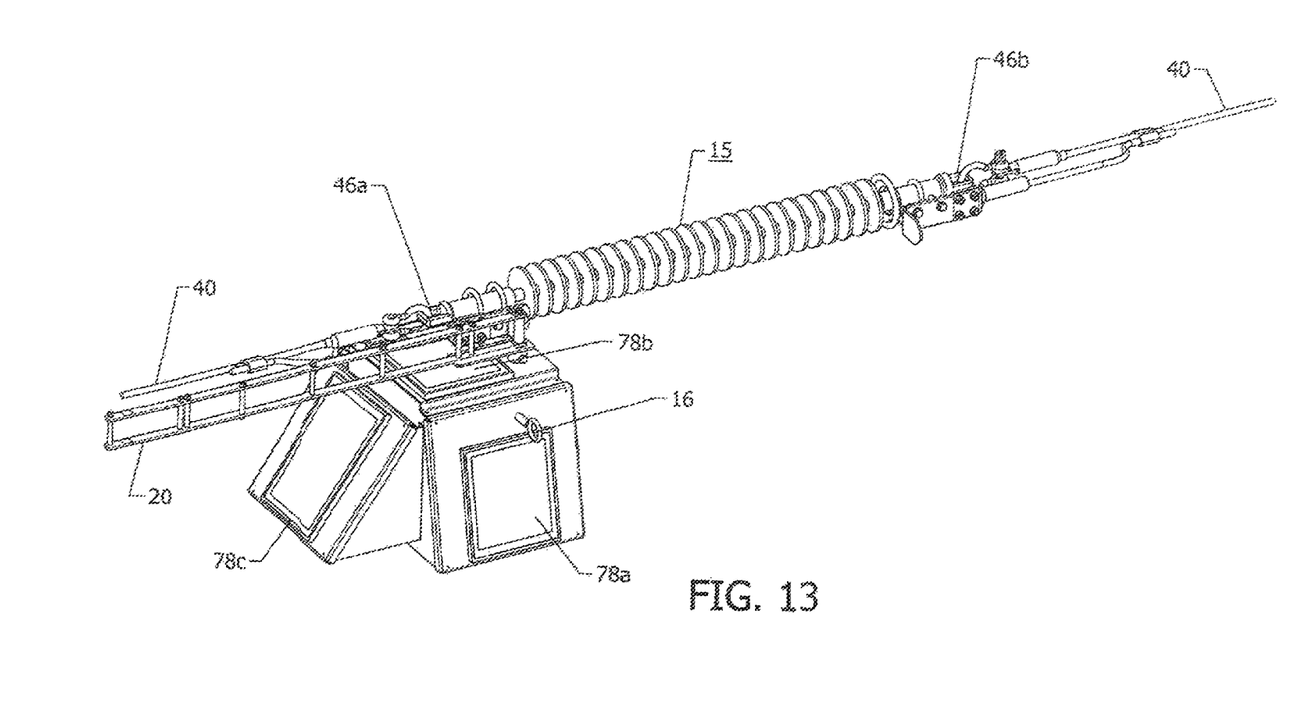
FIG. 13 is a perspective view of an in-line side break disconnect switch of the present invention, showing the switch in the open position.

An alternative embodiment of the motorized in-line air break disconnect switch 10 of the present invention is shown for example, in FIGS. 12A and 13, which is shown as a side break switch 15. The side break switch 15 of the present invention has identical motor drive components as described for the vertical break switch 10, the side break switch 15 having been rotated 90° as shown in FIG. 12A. The switch blade 20 and other current carrying parts are carried above the modified housing 11. FIG. 12B shows a cut away view of the motor 12 and worm drive 48 with hookstick eye 16 for manual operation. The output shaft 25 is arranged vertically so that it is coaxially aligned with the vertical hinge axis "H". Another solar panel 78*c* has been attached to the end side 73 of the housing 11, shown in FIG. 12A. The housing 11 in this embodiment includes also a roof 82 and solar panel 78*b* and panel 78*a* and far side solar panel 78*d*, not shown. The side break switch 15 swings horizontally between the closed and opened positions of the switch as can be seen by comparing FIGS. 12A and 13.

The embodiments disclosed are merely some examples of the various ways in which the invention can be practiced and are not intended to limit the scope of the invention.

What is claimed is:

1. A high voltage in-line air break disconnect switch operatively supported and suspended by and mounted in-line with an electric power line conductor, the high voltage in-line air break disconnect switch having an open non-conductive position and a closed conductive position, the high voltage in-line air break disconnect switch including an elongated strain insulator operatively supported and suspended by the electric power line conductor, an elongated rotating switch blade extending in parallel spaced relationship with and supported by the elongated strain insulator at each end thereof, the elongated rotating switch blade including a hinge contact end and a break jaw contact end, a hinge contact in operative electric circuit arrangement with the elongated rotating switch blade at the hinge end thereof, the hinge contact in operative supportive relationship with a hinge pin, the hinge pin in rotatable supportive relationship with the elongated switch blade at the hinge end, a hinge contact terminal including an integral hinge and a break jaw contact terminal including an integral break jaw operatively supported by the elongated strain insulator at one end thereof, the break jaw contact end of the elongated switch blade in operative electric circuit arrangement with the break jaw contact terminal when the high voltage in-line air break disconnect switch is in the closed position, a first electrical connection in operative electric circuit arrangement between the electric power line conductor and the hinge contact terminal and a second electrical connection in operative electric circuit arrangement between the electric power line conductor and the break jaw contact terminal, the improvement which comprises:

a motor in operative arrangement with an output shaft for causing the hinge end of the elongated rotating switch blade to rotate upon the motor actuation into operative electric closed circuit arrangement with the break jaw contact in the closed conductive switch position and to rotate upon motor actuation out of operative electric closed circuit arrangement with the break jaw contact into the open non-conductive switch position, a communication system including a plurality of communication devices for actuating the motor as desired for causing the elongated rotating switch blade to rotate into operative electric closed circuit arrangement with the break jaw contact in the closed conductive switch position and for causing the elongated rotating switch blade to rotate out of operative electric closed circuit arrangement with the break jaw contact into the open non-conductive switch position, wherein the plurality of communication devices includes a portable wireless hand-held control box including a control box mounted radio for communicating with each of three switch mounted radios to operate each of the three of the high voltage in-line air break disconnect switches of a three phase circuit to open or close each of the high voltage in-line air break disconnect switches as desired, and, an energy supply for powering the motor and the communication system.

2. The high voltage in-line air break disconnect switch of claim 1, wherein the energy supply comprises at least one solar charged battery connected in operative arrangement with the motor and the communication system.

3. The high voltage in-line air break disconnect switch of claim 2, wherein the energy supply further comprises at least one solar panel connected in operative arrangement with the at least one solar charged battery, the motor and the communication system.

4. The high voltage in-line air break disconnect switch of claim 2, further comprising a current transformer in operative arrangement with the at least one solar charged battery.

5. The high voltage in-line air break disconnect switch of claim 1, wherein the in-line air break disconnect switch is a vertical break disconnect switch.

6. The high voltage in-line air break disconnect switch of claim 1, wherein the in-line air break disconnect switch is a side break disconnect switch.

7. The high voltage in-line air break disconnect switch of claim 1, wherein the motor includes an output shaft coupled to a worm drive.

8. The high voltage in-line air break disconnect switch of claim 7, wherein the worm drive includes a worm carried on the motor output shaft and a worm gear carried on the hinge shaft in operative relationship with the worm to open and close the switch blade.

9. The high voltage in-line air break disconnect switch of claim 7, wherein a manual operating eye ring is attached to an end of the motor output shaft.

10. The high voltage in-line air break disconnect switch of claim 1, wherein the communication system further includes a remote terminal unit to translate a radio signal to operate an electric control circuit to actuate the motor motion.

11. The high voltage in-line air break disconnect switch of claim 5, further including a housing adapted to fit over the hinge end of the disconnect switch.

12. The high voltage in-line air break disconnect switch of claim 6, further including a housing under the hinge end operatively attached to one end of the strain insulator below the switch blade.

13. The high voltage in-line air break disconnect switch of claim 3, wherein said at least one solar panel is attached to the housing.

14. The high voltage in-line air break disconnect switch of claim 1, wherein the disconnect switch is opened and closed by portable wireless hand-held control box which carries a radio and an antenna for communicating with the switch.

15. The high voltage in-line air break disconnect switch of claim 1, wherein the portable wireless hand-held control box is battery powered.

16. The high voltage in-line air break disconnect switch of claim 1, further including an arc extinguishing device including a quick break whip operatively attached to the switch blade.

17. The high voltage in-line air break disconnect switch of claim 1, further including a vacuum interrupter operatively attached to the switch break jaw contact terminal.

* * * * *